United States Patent
Pratt

(10) Patent No.: US 7,800,238 B2
(45) Date of Patent: Sep. 21, 2010

(54) SURFACE DEPRESSIONS FOR DIE-TO-DIE INTERCONNECTS AND ASSOCIATED SYSTEMS AND METHODS

(75) Inventor: David S. Pratt, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/147,957

(22) Filed: Jun. 27, 2008

(65) Prior Publication Data

US 2009/0321947 A1    Dec. 31, 2009

(51) Int. Cl.
*H01L 23/48* (2006.01)
*H01L 23/52* (2006.01)
*H01L 29/40* (2006.01)

(52) U.S. Cl. .............................. 257/777; 257/E23.141; 257/E23.178

(58) Field of Classification Search .................. 257/686, 257/737, 693, 678, 685, 777, E23.141, E21.001, 257/782, 676, E23.128; 361/808, 807, 679.01, 361/600; 438/126, 107, 106, 125
See application file for complete search history.

(56) References Cited

U.S. PATENT DOCUMENTS

| | | | |
|---|---|---|---|
| 4,818,728 A * | 4/1989 | Rai et al. ................... | 438/108 |
| 6,780,749 B2 | 8/2004 | Masumoto et al. | |
| 7,190,061 B2 | 3/2007 | Lee et al. | |
| 7,217,596 B2 | 5/2007 | Cobbley et al. | |
| 7,256,073 B2 | 8/2007 | Noma et al. | |
| 2004/0170715 A1 * | 9/2004 | Kata ........................ | 425/35 |
| 2006/0038272 A1 | 2/2006 | Edwards | |

(Continued)

FOREIGN PATENT DOCUMENTS

JP    2001298147 A    10/2001

(Continued)

OTHER PUBLICATIONS

Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007-Jun. 1, 2007, pp. 1179-1185.

(Continued)

*Primary Examiner*—Thomas L Dickey
*Assistant Examiner*—Nikolay Yushin
(74) *Attorney, Agent, or Firm*—Perkins Coie LLP

(57) ABSTRACT

Stacked microelectronic dies employing die-to-die interconnects and associated systems and methods are disclosed herein. In one embodiment, a stacked system of microelectronic dies includes a first microelectronic die, a second microelectronic die attached to the first die, and a die-to-die interconnect electrically coupling the first die with the second die. The first die includes a back-side surface, a surface depression in the back-side surface, and a first metal contact located within the surface depression. The second die includes a front-side surface and a second metal contact located at the front-side surface and aligned with the first metal contact of the first die. The die-to-die interconnect electrically couples the first metal contact of the first die with the second metal contact of the second die and includes a flowable metal layer that at least partially fills the surface depression of the first die.

17 Claims, 8 Drawing Sheets

U.S. PATENT DOCUMENTS

| | | |
|---|---|---|
| 2006/0195729 A1* | 8/2006 | Huppenthal et al. .......... 714/42 |
| 2006/0278980 A1 | 12/2006 | Trezza et al. |
| 2006/0278988 A1 | 12/2006 | Trezza et al. |
| 2006/0281243 A1 | 12/2006 | Trezza |
| 2007/0037379 A1 | 2/2007 | Enquist et al. |
| 2007/0045779 A1 | 3/2007 | Hiatt |
| 2007/0096263 A1 | 5/2007 | Furukawa et al. |
| 2007/0099395 A1 | 5/2007 | Sridhar et al. |
| 2007/0158839 A1 | 7/2007 | Trezza |
| 2007/0182020 A1 | 8/2007 | Trezza et al. |
| 2007/0197013 A1 | 8/2007 | Trezza |
| 2007/0222054 A1 | 9/2007 | Hembree |
| 2007/0228576 A1 | 10/2007 | Trezza |
| 2007/0228926 A1 | 10/2007 | Teo et al. |
| 2007/0262424 A1 | 11/2007 | Hiatt |

FOREIGN PATENT DOCUMENTS

| | | |
|---|---|---|
| JP | 2005093980 A | 4/2005 |
| KR | 20020061812 A | 7/2002 |
| WO | 2005022965 A2 | 3/2005 |
| WO | 2006124597 A2 | 11/2006 |

OTHER PUBLICATIONS

Schaper, L. et al., "Integrated System Development for 3-D VLSI," Electronic Components and Technology Conference, 2007, ECTC '07, Proceedings, 57th, May 29, 2007-Jun. 1, 2007, pp. 853-857.

Tezcan, D.S. et al., "Sloped Through Wafer Vias for 3D Wafer Level Packaging," Electronic Components and Technology Conference, 2007, ECTC '07, Proceedings, 57th, May 29, 2007-Jun. 1, 2007, pp. 643-647.

* cited by examiner

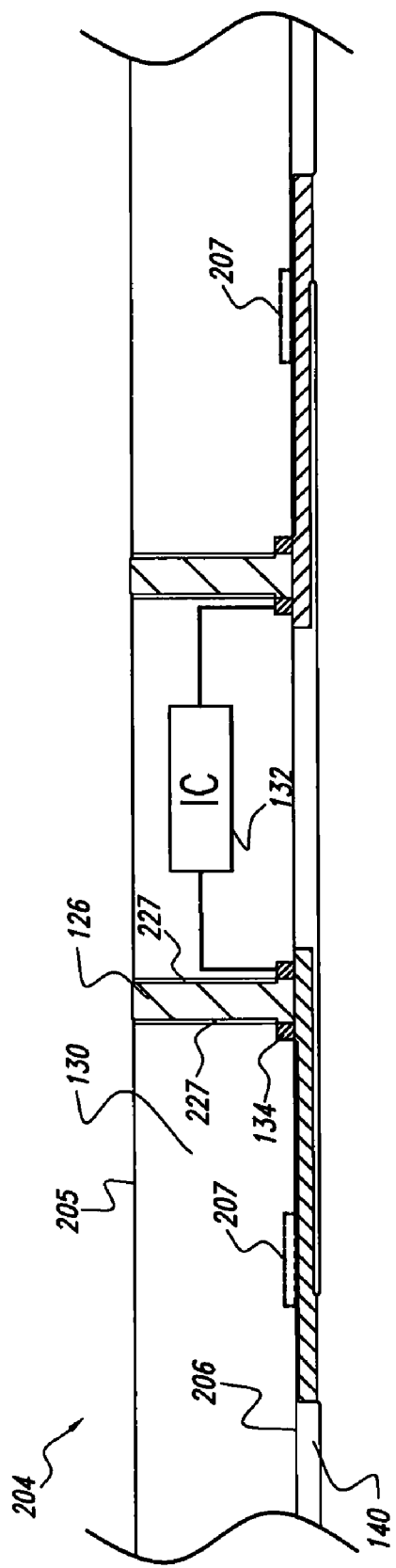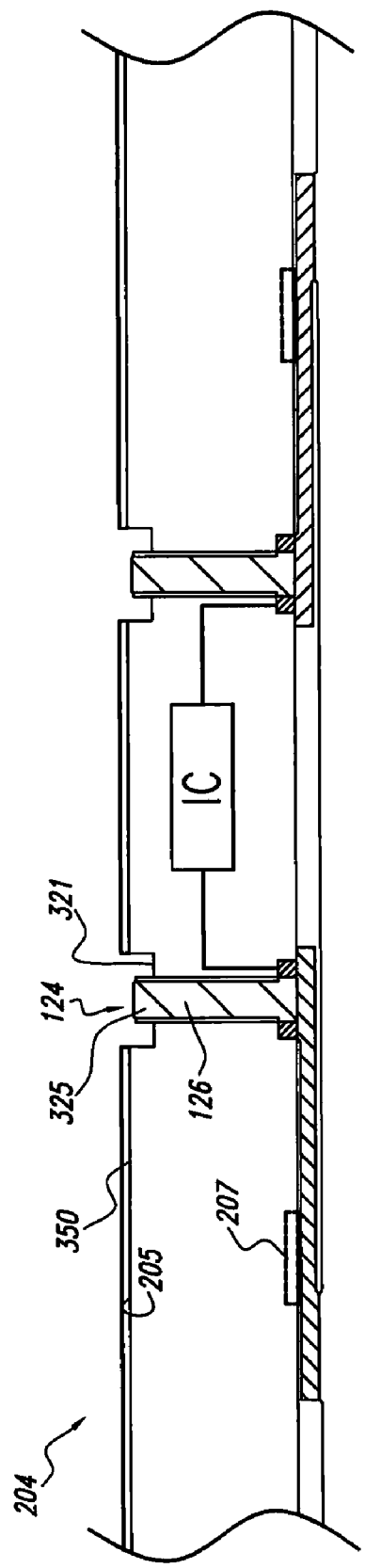

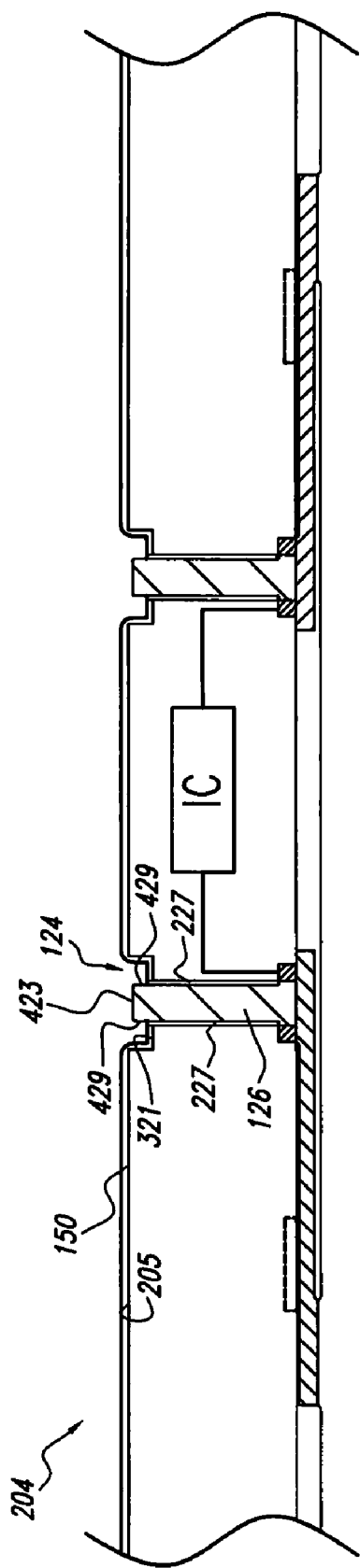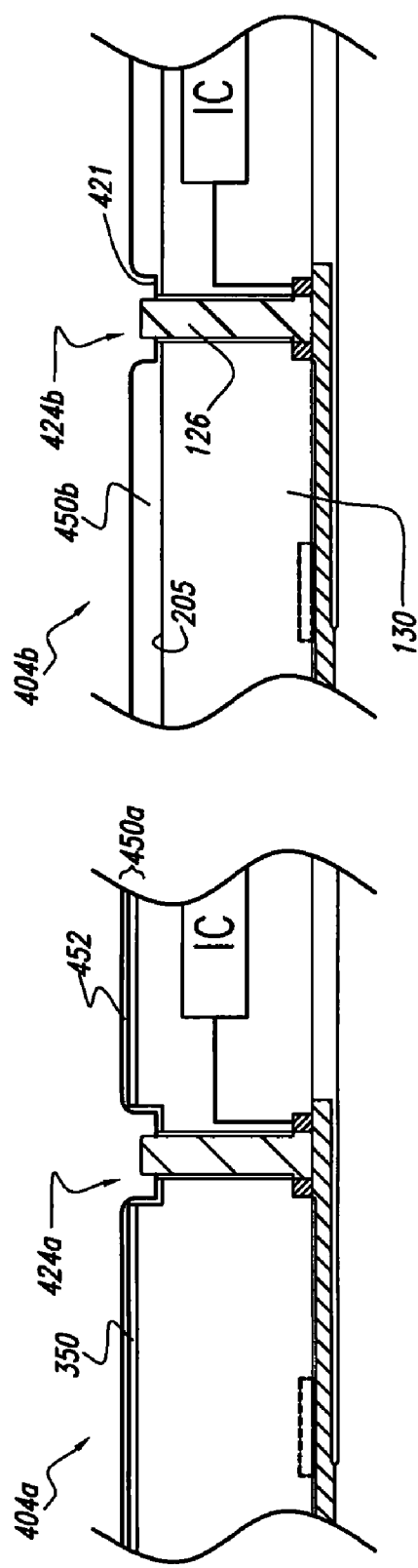
Fig. 4A
Fig. 4B
Fig. 4C

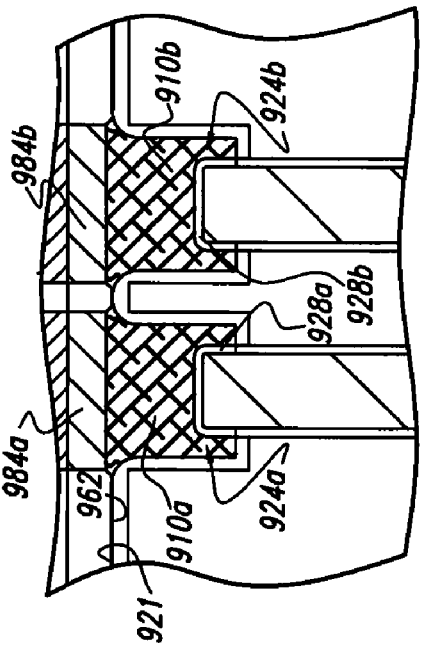
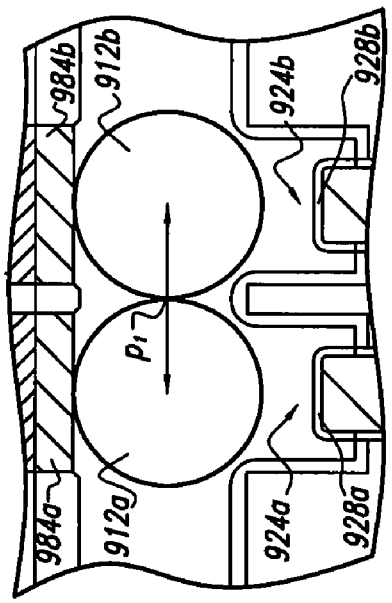
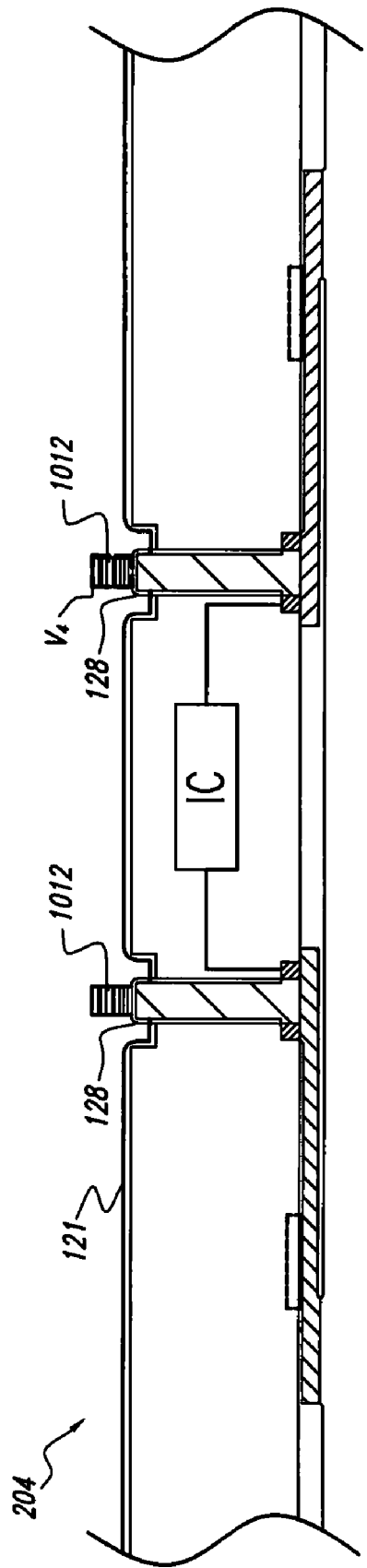

SURFACE DEPRESSIONS FOR DIE-TO-DIE INTERCONNECTS AND ASSOCIATED SYSTEMS AND METHODS

TECHNICAL FIELD

The present disclosure is directed generally to microelectronic die packages, and more particularly to stacked microelectronic dies having die-to-die interconnects.

BACKGROUND

Packaged microelectronic assemblies, such as memory chips and microprocessor chips, typically include a microelectronic die mounted to a substrate and encased in a plastic protective covering. The die includes functional features, such as memory cells, processor circuits, and interconnecting circuitry. The die also typically includes bond pads electrically coupled to the functional features. The bond pads are electrically connected to pins or other types of terminals that extend outside the protective covering for connecting the die to busses, circuits, or other microelectronic assemblies. In one conventional arrangement, the die is mounted (face down) to a supporting substrate (e.g., a printed circuit board), and the die bond pads are electrically coupled to corresponding bond pads of the substrate with metal bumps (e.g., solder balls or other suitable connections). After encapsulation, additional metal bumps can electrically connect the substrate to one or more external devices. Accordingly, the substrate supports the die and provides an electrical link between the die and the external devices.

Die manufacturers have come under increasing pressure to reduce the volume occupied by the dies and yet increase the capacity of the resulting encapsulated assemblies. To meet these demands, die manufacturers often stack multiple dies on top of each other to increase the capacity or performance of the device within the limited surface area on the circuit board or other element to which the dies are mounted.

BRIEF DESCRIPTION OF THE DRAWINGS

FIGS. 2-6 illustrate stages of forming the system of FIG. 1 in accordance with several embodiments of the disclosure.

FIGS. 9A and 9B illustrate stages of forming die-to-die interconnects in accordance with yet another embodiment of the disclosure.

FIG. 10 is a cross-sectional side view of a microelectronic workpiece carrying structures that can be used to form die-to-die interconnects in accordance with another embodiment of the disclosure.

DETAILED DESCRIPTION

Various embodiments of microelectronic dies and/or systems of dies that include die-to-die interconnects are described below. In many embodiments, such die-to-die interconnects can encompass a conductive structure that electrically couples a metal contact at a front side of a microelectronic die with a metal contact at a back-side of another microelectronic die (e.g., including pass-through 3D interconnects or through-die or through-silicon vias). Such microelectronic dies can encompass a myriad of substrates having any of a variety of conductive and/or nonconductive layers (e.g., metallic, semiconductive, and/or dielectric materials) that are situated upon and/or within one another. These substrates can also include a variety of electrical devices (e.g., transistors, resistors, capacitors, etc.) or systems of such devices (e.g., an integrated circuit, a memory, a processor, etc.) formed in the conductive and/or nonconductive layers of an individual substrate. Other embodiments of die-to-die interconnects, substrates, and microelectronic dies and/or systems of dies in addition to or in lieu of the embodiments described in this section may have several additional features or may not include many of the features shown and described below with reference to FIGS. 1-11.

Figure 1:
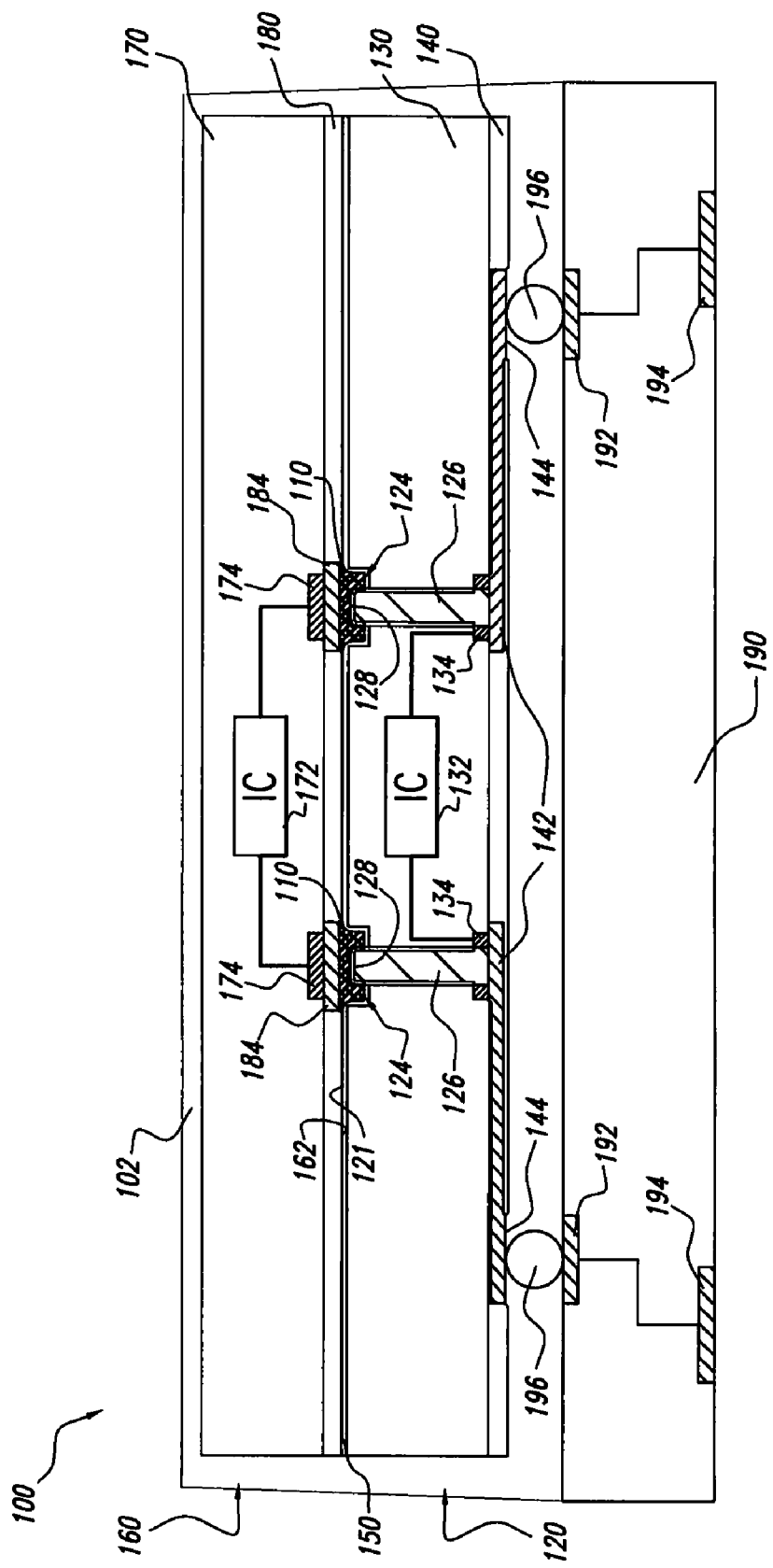
FIG. 1 is a cross-sectional side view of a system of stacked microelectronic dies having die-to-die interconnects configured in accordance with an embodiment of the disclosure.

FIG. 1 is a cross-sectional side view of an embodiment of a system 100 of stacked microelectronic dies 120 and 160. The first die 120 includes a back-side surface 121, surface depressions 124 in the back-side surface 121, and pass-through 3D interconnects 126 having individual back-side contact portions 128 in the surface depressions 124. The pass-through interconnects 126, for example, can extend through the first die 120 to electrically couple the back-side contact portions 128 to front-side pads on an opposing side of the first die 120. The second die 160 has a front-side surface 162 coupled to the back-side surface 121 of the first die 120. The second die 160 also includes front-side metal contacts 184 (e.g., redistribution layer bond pads) located at the front-side surface 162 that are aligned with the pass-through interconnects 126. In the embodiment of FIG. 1, the system 100 includes individual die-to-die interconnects 110 coupling the back-side contact portions 128 of the first die 120 with the front-side contacts 184 of the second die 160. In several embodiments, the individual die-to-die interconnects 110 include flowable solder that at least partially fills the surface depressions 124 (e.g., alloys that include tin, silver, and/or copper, as well as other elemental constituents such as bismuth, indium, zinc, and/or lead). However, in other embodiments, the die-to-die interconnects 110 can include other types of flowable metal.

Embodiments of the first die 120 can include a substrate 130, an integrated circuit 132 carried by the substrate 130, and substrate bond pads 134 (or contacts) coupled to the integrated circuit 132. The first die 120 can have a first redistribution layer 140 at the front side of the substrate 130 that includes metal traces 142 coupling the substrate bond pads 134 to front-side metal contacts 144. The first die can also have a dielectric layer 150 defining the back-side surface 121. The dielectric layer 150 separates the substrate 130 from the second die 160 and it spaces the substrate 130 apart from the die-to-die interconnects 110. Similar to the first die 120, the second die 160 can include a substrate 170, an integrated circuit 172 carried by the substrate 170, and substrate bond pads 174 coupled to the integrated circuit 172. A second redistribution layer 180 can be attached to the substrate 170 and include the front-side contacts 184 and optionally traces (not shown) electrically coupled to the substrate bond pads 174.

Embodiments of the system 100 can also include a dielectric casing 102 encapsulating the first and second dies 120 and 160, and an interposer substrate 190 carrying the first and second dies 120 and 160. The interposer substrate 190, for example, can be a printed circuit board or other substrate that includes die bond pads 192 and package bond pads 194 electrically coupled to the die bond pads 192 through the substrate 190. In several embodiments, individual bump bonds 196 or other electrical connectors are aligned with and attached to individual front-side metal contacts 144 of the first die 120 and individual die bond pads 192 of the interposer substrate 190. Accordingly, individual package bond pads 194 can provide an electrical coupling to the integrated circuit 132 of the first die 120 and/or the integrated circuit 172 of the second die 160.

In many embodiments, the die-to-die interconnects 110 have undergone a reflow process (described further with reference to FIGS. 7A and 7B) that allows individual die-to-die interconnects to at least partially fill corresponding surface depressions 124. The depressions 124 in combination with the reflowed die-to-die interconnects 110 enable the first and second dies 120 and 160 to be spaced apart by a very small die-to-die gap or spacing between the back-side and front-side surfaces 121 and 162. For example, in the specific embodiment of FIG. 1, the depressions 124 enable the front-side surface 162 of the second die 160 to contact the back-side surface 121 of the first die 120 and thus eliminate a die-to-die gap between the first die 120 and the second die 160. The system 100 can accordingly have a low overall height of a die package.

In contrast to the system 100, conventional die packages typically employ dies having fixed and relatively large die-to-die gaps. In general, the size of a die-to-die gap is constrained to a minimum of about the size of conventional die-to-die interconnects. For example, conventional die packages can employ bump bonds having diameters ranging in size from 0.1 mm to 0.4 mm. The die-to-die gap of such packages is thus constrained to a minimum height of at least 0.1 mm to 0.4 mm. The die-to-die gap of conventional stacked packages can accordingly contribute 0.1 mm to 0.4 mm to the overall height of the package for each pair of stacked dies on a package. Stacked systems with three or more dies that have multiple die-to-die gaps can further contribute to the overall height of a die package.

The surface area of conventional die packages is also affected by conventional bump bonds because the diameter of bump bonds limits the minimum lateral spacing between front-side contacts or back-side contacts. Individual bump bonds generally cannot be electrically connected to each other across the surface of a die because such connections would cause shorting. As such, the center-to-center spacing between contacts is greater than the diameter of the bump bonds to avoid shorting. The spacing distance between bump bonds is typically much greater than diameter of the bump bonds to accommodate alignment tolerances and because bump bonds typically bulge towards one another when compressed between dies.

Embodiments of the system 100, however, mitigate the issues associated with die-to-die gaps and lateral spacing requirements between die contacts. In many embodiments, the system 100 can be manufactured by initially positioning metal bumps between the back-side and front-side contacts of individual dies. The metal bumps can be heated and then formed into individual surface depressions adjacent to back-side contacts. As the metal from the bumps flows into or otherwise forms to the surface depressions, the die-to-die gap between individual dies is reduced or eliminated. In addition, because the metal flows into individual surface depressions that are electrically isolated from each other, the back-side contacts of a die can be closely spaced. In several embodiments, reflowed metal can be contained within individual surface depressions to prevent electrical contacts from becoming inadvertently electrically shorted (described further with reference to FIGS. 9A and 9B).

FIGS. 2-6 illustrate stages of methods for forming the system 100 including the die-to-die interconnects 110 (FIG. 1) in accordance with several embodiments of the disclosure. FIG. 2 is a cross-sectional side view of a microelectronic workpiece 204 (e.g., a semiconductor or microelectronic wafer) having a back-side surface 205, a front-side surface 206, and alignment features or fiducials 207 located at the front-side surface 206. The alignment features 207 can be used to identify locations at the back-side surface 205 and associate them with locations at the front-side surface 206 (e.g., when defining a pattern at the back-side surface 205; described further with reference to FIG. 3B). FIG. 2 also shows the first redistribution layer 140 at the front-side surface 206 and the pass-through interconnect 126 extending between the front-side surface 206 and the back-side surface 205. In many examples, a backgrinding or chemical mechanical polish (CMP) process is used to thin the workpiece 204 such that the pass-through interconnect 126 projects slightly beyond the back-side surface 205. The pass-through interconnect 126 can optionally extend through an individual substrate bond pad 134, and the pass-through interconnect 126 can be electrically coupled to the integrated circuit 132 via the substrate bond pad 134. In a specific embodiment, the pass-through interconnect 126 includes a plated metal, such as copper, but the pass-through interconnect 126 can also include other conductive materials and/or semiconductive materials in other embodiments (e.g., tungsten, titanium, titanium-nitride, etc.). A passivation layer 227 (e.g., an aluminum oxide or silicon oxide layer) can also separate and electrically isolate the pass-through interconnect 126 from the substrate 130 and optionally the substrate bond pad 134.

Figure 3B:
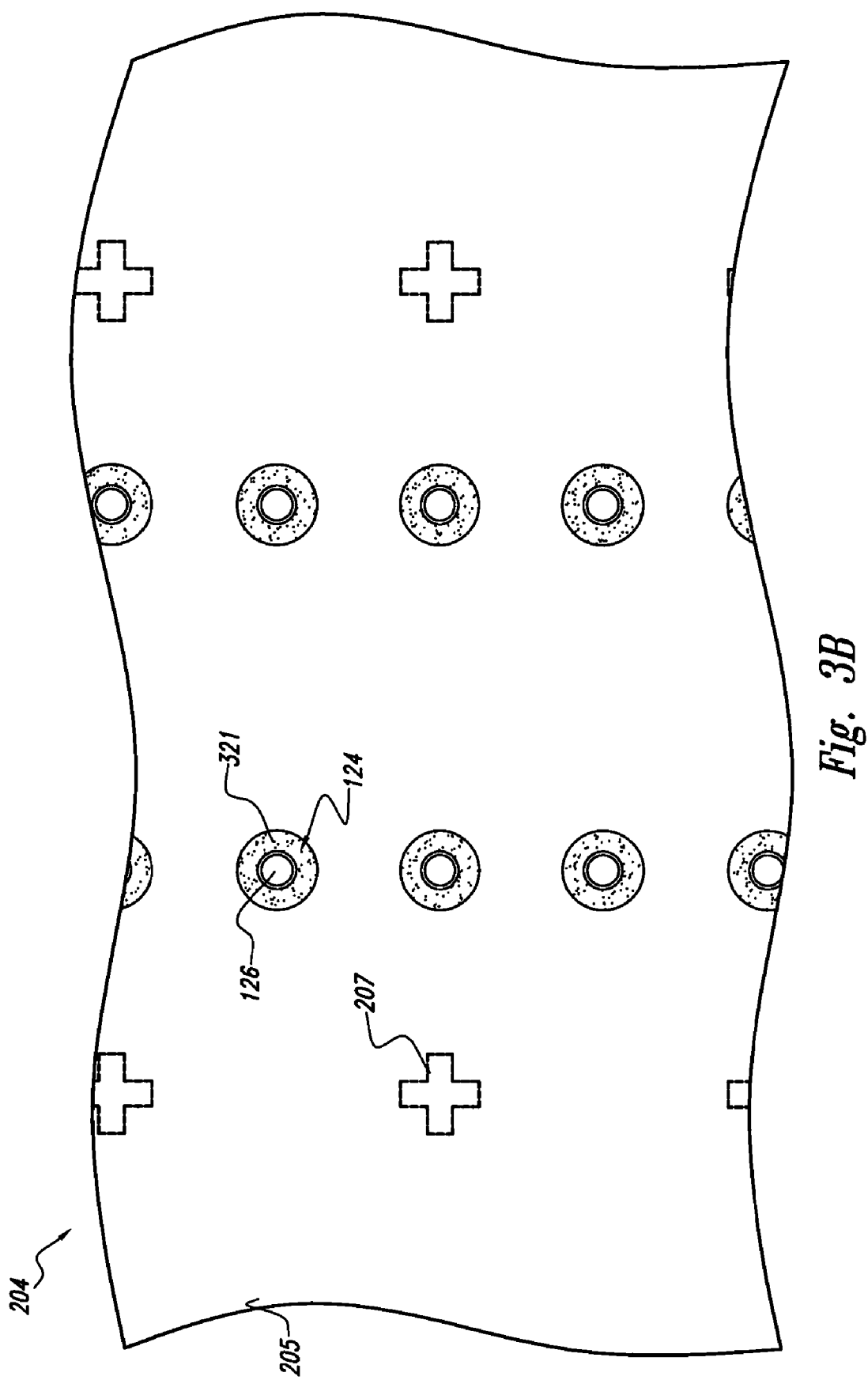

FIGS. 3A and 3B are cross-sectional side and top plan views of the workpiece 204 after forming and patterning a masking layer 350 and etching the workpiece 204 to form the surface depressions 124. FIG. 3A shows the workpiece 204 after an etch process has created a depressed or recessed surface 321 relative to the back-side surface 205 at a site adjacent to the pass-through interconnect 126. The recessed surface 321 is the bottom of the depression 124. In several embodiments, a projection portion 325 of the pass-through interconnect 126 projects beyond the recessed surface 321. The surface depression 124 can be circular, rectangular, or in other configurations, and the surface depression 124 can surround one or more interconnects in whole or in part.

FIG. 3B also shows the relationship between the interconnects 126 and the alignment feature 207. Although the alignment feature 207 is generally not visible at the back-side surface 205 using visible radiation, it can be detected using an infrared light source or other irradiation. The workpiece 204, for example, can be silicon, which is generally transparent to infrared light. An alignment tool can use infrared light to detect the alignment feature 207 for subsequent patterning and/or processing of the workpiece 204 at or above the back-side surface 205. In many embodiments, the surface depression 124 can mitigate the extent to which the back-side surface 205 of the workpiece 204 is roughened. Typically, the etching process carried out in FIGS. 3A and 3B can pit the recessed surface 321 or etch the recessed surface 321 non-uniformly. Consequently, when infrared light impinges at the recessed surface 321 (or is reflected back from the recessed surface 321), the infrared light can scatter. Such scattering of the infrared light decreases the optical resolution of the alignment feature 207, which in turn makes it more difficult to detect the alignment feature. However, referring again to FIG. 3A, the masking layer 350 protects the surface quality of the back-side surface 205 above the alignment feature 207 by preventing it from becoming roughened during an etch process. As such, infrared light employed to detect the alignment feature 207 will not scatter such that the alignment feature 207 can be accurately detected.

FIG. 4A is a cross-sectional side view of the workpiece 204 after forming the dielectric layer 150. In the example of FIG. 4A, the masking layer 350 (FIG. 3A) has been removed, and the dielectric layer 150 has been formed at the back-side surface 205 and at the recessed surface 321. The dielectric layer 150 can be spin-coated, for example, such that the dielectric layer 150 partially fills the surface depression 124 but does not cover a top-side portion 423 of the pass-through interconnect 126. In several embodiments, an additional etching process can remove portions of the passivation layer 227 from side wall portions 429 of the pass-through interconnect 126 using, for example, a dilute hydrofluoric (HF) etch.

FIGS. 4B and 4C are cross-sectional side views of workpieces 404a and 404b having alternative embodiments of the dielectric layer 150. FIG. 4B shows a dielectric layer 450a including a portion of the masking layer 350 and a spin-coated dielectric layer 452. In this example, the masking layer 350 is not removed after the etch process of FIGS. 3A and 3B. Instead, the masking layer 350 is used in combination with the spin-coated dielectric layer 452 to create a surface depression 424a. The masking layer 350 can include, for example, a silicon oxide material or a polymeric material (e.g., polybutadiene (PBD) or benzocyclobutene (BCB)).

Referring to FIG. 4C, a dielectric layer 450b is patterned to include a surface depression 424b. In this embodiment, the back-side surface 205 of the workpiece 404b is not locally etched to form the recessed surface 321 (FIGS. 3A and 3B), but rather the dielectric layer 450b can be patterned/etched to form a recessed surface 421. For example, the pass-through interconnect 126 can be initially formed through the substrate 130, and the back-side surface 205 can be globally etched such that the pass-through interconnect 126 extends above the back-side surface. The dielectric layer 450b can then be deposited at the back-side surface 205 and the recessed surface 421 can be formed adjacent to the pass-through interconnect 126. The recessed surface 421 can accordingly be employed in lieu of the recessed surface 321.

Figure 5:
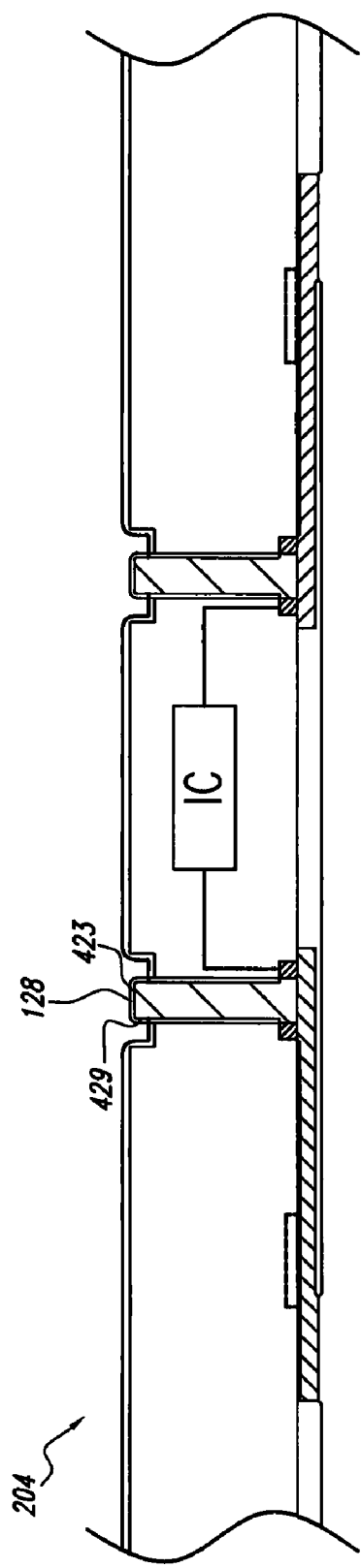

FIG. 5 is a cross-sectional side view of the workpiece 204 after forming the back-side contact portion 128. In several embodiments, an under-bump metallization (UBM) material can be applied to the pass-through interconnect 126 to promote bonding of the die-to-die interconnect 110 (FIG. 1). Such a UBM material can include, for example, layers of nickel/palladium/gold or other alloys. In other embodiments, however, the UBM can be omitted and the die-to-die interconnect 110 can be directly connected to the sidewall portion 429 and/or the top-side portion 423 of the pass-through interconnect 126.

Figure 6:
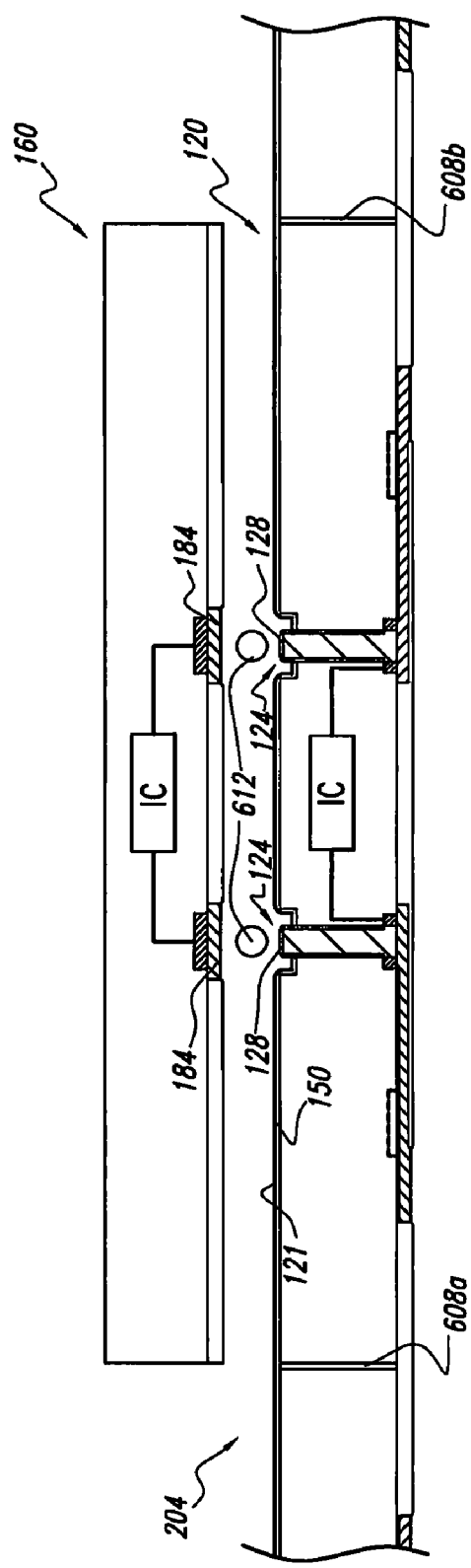

FIG. 6 is a partially exploded cross-sectional side view of the workpiece 204 during inter-die bonding and die singulation. The second die 160 is aligned with and coupled to the workpiece 204 by forming metal bumps 612 between, respectively, the back-side contact portions 128 and the front-side contacts 184. For example, the back-side surface 121 of the workpiece 204 may include fiducials or other types of alignment markers (not shown) for accurate alignment between the front-side contacts 184 and the back-side contact portions 128 and/or the pass-through interconnects 126. When the second die 160 is aligned with the workpiece 204, the second die 160 can be pressed against the workpiece 204 to sandwich individual metal bumps 612 in between individual surface depressions 124 and individual front-side contacts 184. Heat and pressure can be applied such that the metal bumps 612 deform (or reflow) to produce the die-to-die interconnects 110 (FIG. 1). For example, a mechanical device (e.g., a clamp) can press together the second die 160 and the workpiece 204 while the workpiece 204 and the second die 160 are concurrently heated in a furnace chamber (generally below 300° F.). After deforming the metal bumps 612 (described in more detail with reference to FIGS. 7A and 7B), the first die 120 can be singulated from the workpiece 204 via a die cutting process at substrate cutting lanes 608a and 608b to separate the assembly of the first and second dies 120 and 160 from the workpiece 204. This assembly can then be mounted and electrically coupled to a variety of substrates, such as the interposer substrate 190 (FIG. 1). In other embodiments, this assembly can be coupled with other types of structures for carrying and/or electrically coupling with the first and second dies 120 and 160.

Figure 7A:
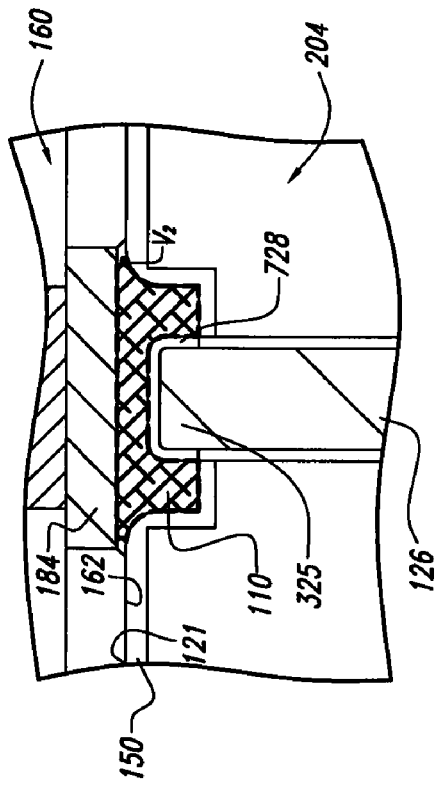
FIGS. 7A and 7B illustrate, in more detail, stages of forming the die-to-die interconnects of the system of FIG. 1.
Figure 7B:
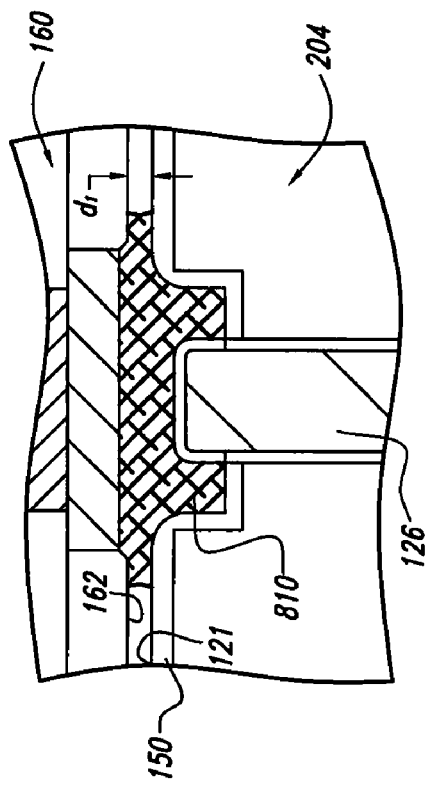

FIGS. 7A and 7B are cross-sectional side views showing, in more detail, an individual metal bump 612 being reflowed and conforming to a shape defined by the surface depression 124, the front-side contact 184, and the projection portion 325 of the pass-through interconnect 126. In the examples of FIGS. 7A and 7B, the projection portion 325 is lined with a UBM material 728 that promotes bonding. In other examples, however, the UBM material 728 can be omitted. Referring to FIG. 7A, heat and pressure are applied to the metal bump 612 until the metal bump 612 deforms and at least partially fills a volume $V_1$ defined by the dielectric layer 150 and the pass-through interconnect 126 within the surface depression 124. As the metal bump 612 deforms with applied heat and pressure, the front-side surface 162 of the second die 160 moves towards the back-side surface 121 of the workpiece 204.

Referring to FIG. 7B, the metal bump 612 (FIGS. 6 and 7A) has deformed until it forms the die-to-die interconnect 110. In this example, the front-side surface 162 of the second die 160 contacts the back-side surface 121 to eliminate a gap between the second die 160 and the workpiece 204. In several embodiments, the die-to-die interconnect 110 and/or metal bump 612 can have a volume $V_2$ that is less than or equal to the volume $V_1$ of the surface depression 124 (FIG. 7A). However, in other examples, embodiments of the die-to-die interconnect 110 and/or metal bump 612 can also have a volume that is greater than the volume $V_1$.

Figure 8A:
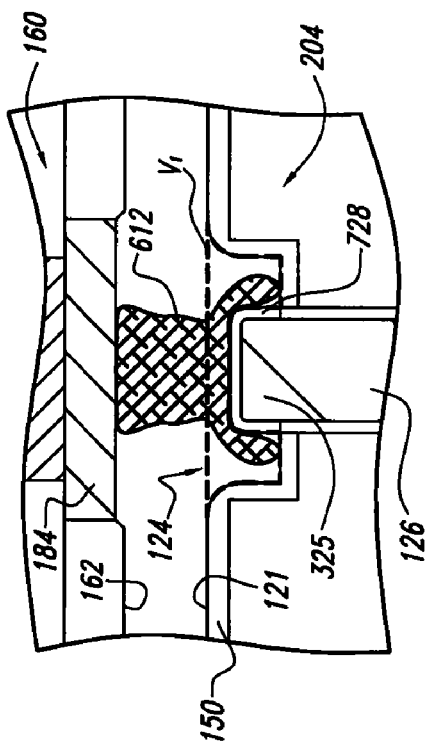
FIGS. 8A and 8B illustrate stages of forming die-to-die interconnects in accordance with another embodiment of the disclosure.
Figure 8B:
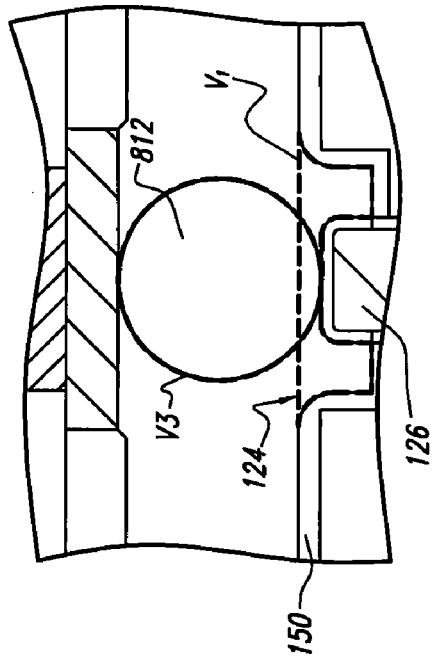

FIG. 8A, for example, is a cross-sectional side view of a metal bump 812 having a volume $V_3$ that is larger than the volume $V_1$ of the surface depression 124. FIG. 8B shows a corresponding die-to-die interconnect 810 formed from the metal bump 812 and a die-to-die gap $d_1$ between the back-side surface 121 of the workpiece 204 and the front-side surface 162 of the second die 160. As described above, the size of the die-to-die gap $d_1$ can be adjusted by adjusting the ratio of the volume of an individual metal bump (or other die-to-die interconnect structure) to the volume of a corresponding surface depression. For example, the volume $V_3$ of the metal bump can be adjusted to minimize the die-to-die gap. Likewise, the volume of the surface depression 124 can also be adjusted.

In many embodiments, the above described metal reflowing techniques can be used in lieu of direct bonding techniques. In general, direct bonding can be carried out by bonding front-side die contacts with back-side die contacts without employing any intermediary metal (i.e., the metal bumps 612 and 812). Copper-to-copper bonding, for example, has the potential for allowing closer die-contact-to-die-contact spacings than have been available with conventional solder bump bonding. Although promising, direct bonding techniques may not be readily available. In addition, the cost associated with these techniques may be prohibitive because they require special tooling and processing equipment. The metal reflow techniques described herein, however, can be readily carried out using conventional tooling and microelectronic manufacturing processes.

For example, FIGS. 9A and 9B are cross-sectional side views showing metal bumps 912a and 912b, and a process for reflowing the metal bumps into separate die-to-die interconnects 910a and 910b. In FIG. 9A, the metal bumps 912a and 912b are positioned between corresponding front-side contacts 984a and 984b and corresponding surface depressions 924a and 924b and back-side contact portions 928a and 928b. FIG. 9A also shows the metal bumps 912a and 912b contacting one another and spaced according to a pitch $p_1$. Prior to reflowing the metal bumps 912a and 912b, the front-side contacts 984a and 984b are electrically shorted with each other, and the back-side contact portions 928a and 928b are electrically shorted with each other. Referring now to FIG. 9B, the metal bumps 912a and 912b (FIG. 9) have been reflowed, and the corresponding surface depressions 924a and 924b are filled, respectively, by the die-to-die interconnects 910a and 910b. FIG. 9B also shows a front-side surface 962 contacting a back-side surface 921, and the die-to-die interconnects 910a and 910b being separated from one another by these contacting surfaces. Thus, the front-side contacts 984a and 984b are now electrically isolated from one another, and the back-side contact portions 928a and 928b are also electrically isolated from one another.

Embodiments of die-to-die interconnects can also be formed using other configurations of solder or flowable metal. FIG. 10 is a cross-sectional side view of the workpiece 204 showing metal tier structures 1012 attached to the back-side contact portions 128. Similar to metal bumps (see, e.g., the metal bump 612 of FIG. 6), the tier structures 1012 can be reflowed and have a volume $V_4$ that can be sized according to the volume $V_1$ of a corresponding surface depression 124 (FIG. 7A). The tier structures 1012 can be formed by a process that includes (a) forming a mask layer at the back-side surface 121, (b) patterning the mask layer, and (c) depositing one or more metal layers in the patterned portions of the mask layer. (The mask layer and the tier structures 1012 can also be formed at the front-side surface 162 of the second die 160; FIG. 6). After forming the tier structures 1012, the mask layer can be removed, the second die 160 can be positioned on top of the workpiece 204, and the tier structures 1012 can be reflowed by a process similar to that described with reference to FIGS. 7A-9B.

Figure 11:
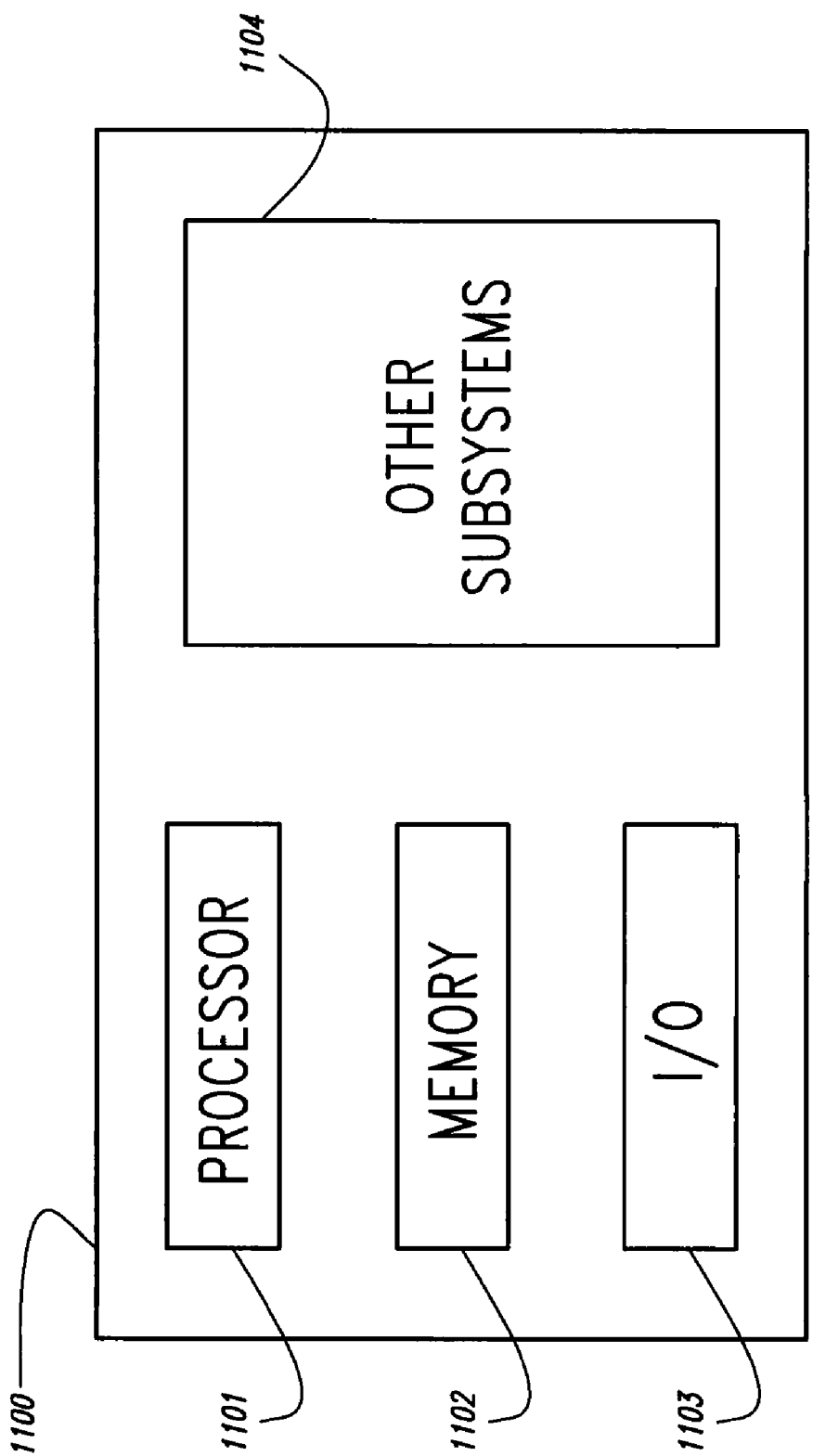
FIG. 11 is a schematic illustration of a system in which die-to-die interconnects may be incorporated.

Any one of the die-to-die interconnects described above with reference to FIGS. 1-10 can be incorporated into any of a myriad of larger or more complex systems 1100, a representative one of which is shown schematically in FIG. 11. The system 1100 can include a processor 1101, a memory 1102 (e.g., SRAM, DRAM, Flash, or other memory device), input/output devices 1103, or other subsystems or components 1104. Microelectronic devices may be included in any of the components shown in FIG. 11. The resulting system 1100 can perform any of a wide variety of computing, processing, storage, sensor, imaging, or other functions. Accordingly, representative systems 1100 include, without limitation, computers or other data processors, for example, desktop computers, laptop computers, Internet appliances, hand-held devices (e.g., palm-top computers, wearable computers, cellular or mobile phones, personal digital assistants), multi-processor systems, processor-based or programmable consumer electronics, network computers, and minicomputers. Other representative systems 1100 include cameras, light or other radiation sensors, servers and associated server subsystems, display devices, or memory devices. In such systems, individual dies can include imager arrays, such as CMOS imagers. Components of the system 1100 may be housed in a single unit or distributed over multiple, interconnected units, e.g., through a communications network. Components can accordingly include local or remote memory storage devices and any of a wide variety of computer-readable media.

From the foregoing, it will be appreciated that specific embodiments have been described herein for purposes of illustration, but well-known structures and functions have not been shown or described in detail to avoid unnecessarily obscuring the description of the embodiments. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature or additional types of other features are not precluded.

It will also be appreciated that specific embodiments have been described herein for purposes of illustration but that various modifications may be made within the claimed subject matter. For example, embodiments of the stacked system 100 can employ die-to-die interconnects 110 that electrically couple a variety of electrical contacts, in addition to or in lieu of those that are associated with pass-through interconnects. In addition, interconnects may be employed in a variety of systems, including systems having two levels of microelectronic dies or stacked systems of three or more levels of microelectronic dies. The described methods of forming a stacked system can also include various modifications. The die-to-die interconnects 110, for example, can be formed after the first die 120 has been singulated from the workpiece 204. Furthermore, many of the elements of one embodiment can be combined with other embodiments in addition to, or in lieu of, the elements of the other embodiments. For example, embodiments of the stacked system 100 can employ two or more different types of die-to-die interconnects, such as those that are closely spaced (see, e.g., FIGS. 9A and 9B) and those that are more remotely spaced. Accordingly, the invention is not limited except as by the appended claims.

I claim:

1. A system of stacked microelectronic dies, comprising:
   a first microelectronic die having a back-side surface, a surface depression in the back-side surface, and a first metal contact located within the surface depression;
   a second microelectronic die having a front-side surface and a second metal contact located at the front-side surface and aligned with the first metal contact; and
   a die-to-die interconnect coupling the first metal contact with the second metal contact, the die-to-die interconnect including a flowable metal material that at least partially fills the surface depression;
   wherein the surface depression comprises a first surface depression, the die-to-die interconnect comprises a first die-to-die interconnect, and the flowable metal material comprises a first flowable metal material, and wherein the first die further includes a second surface depression having a second flowable metal material that at least partially fills the second surface depression, the second flowable metal material being associated with a second die-to-die interconnect and being electrically isolated from the first flowable metal material, and wherein the first metal contact does not project beyond a plane defined by the back-side surface of the first microelectronic die.

2. The system of claim 1 wherein the first die further includes a substrate, and wherein the surface depression is lined with a dielectric layer that separates the flowable metal of the die-to-die interconnect from the substrate of the first die.

3. The system of claim 1, further comprising a through-die interconnect extending through the first die and being electrically coupled with the flowable metal of the die-to-die interconnect.

4. The system of claim 1 wherein the flowable metal of the die-to-die interconnect comprises a reflowed solder bump.

5. The system of claim 1 wherein the back-side surface of the first die is contacting the front-side surface of the second die.

6. The system of claim 1 wherein the back-side surface of the first die is separated from the front-side surface of the second die by a gap having a thickness of less than 0.4 mm.

7. A system of stacked microelectronic dies, comprising:
a first microelectronic die having a back-side surface, a plurality of surface depressions in the back-side surface, and a plurality of through-die interconnects extending through the first microelectronic die, wherein each surface depression has a recessed surface spaced inwardly from a plane defined by the back-side surface, and wherein the through-die interconnects are aligned with corresponding depressions in the back-side surface and have contact portions projecting beyond the recessed surfaces;
a second microelectronic die having a front-side surface and a plurality of metal contacts located at the front-side surface, wherein the metal contacts are aligned with corresponding through-die interconnects; and
a plurality of die-to-die interconnects, wherein each die-to-die interconnect couples a contact portion of one of the through-die interconnects with a corresponding metal contact at the front side of the second microelectronic die, and each die-to-die interconnect comprises a reflowed metal material that at least partially fills one of the surface depressions such that the die-to-die interconnects are electrically isolated from each other.

8. The system of claim 7, further comprising a spun-on dielectric layer on the back-side surface and the recessed surfaces of the first microelectronic die.

9. The system of claim 7 wherein individual surface depressions have a Volume $V_1$ and individual die-to-die interconnects have a Volume $V_2$ less than or equal to Volume $V_1$.

10. The system of claim 7 wherein individual surface depressions have a volume $V_1$ and individual die-to-die interconnects have a volume $V_2$ greater than volume $V_1$.

11. The system of claim 7 wherein individual die-to-die interconnects comprise reflowed metal bumps that conform to the surface depressions in the back-side of the first microelectronic die.

12. The system of claim 7, further comprising a dielectric layer on the back-side surface and the recessed surfaces of the first microelectronic die, and wherein the front-side surface of the second microelectronic die contacts the dielectric layer on the back-side surface of the first microelectronic die, and wherein individual die-to-die interconnects are contained in corresponding surface depressions in the first microelectronic die.

13. A system of stacked microelectronic dies, comprising:
a first microelectronic die having a back-side surface;
a plurality of surface depressions in the back-side surface;
a recessed surface spaced inwardly from a plane defined by the back-side surface, and a back-side contact, at substantially each surface depression;
a plurality of through-die interconnects extending through the first microelectronic die, with substantially each of the through-die interconnects connecting to a respective back-side contact;
a second microelectronic die having a front-side surface having a plurality of front-side contacts located at the front-side surface;
a plurality of die-to-die interconnects, wherein substantially each die-to-die interconnect connects one of the through-die interconnects with a corresponding front-side contact of the second microelectronic die, and substantially each die-to-die interconnect comprises a reflowed metal material that at least partially fills one of the surface depressions.

14. The system of claim 13 wherein the surface depressions are locally etched into the back-side surface of the first microelectronic die.

15. The system of claim 13 wherein at least one of the plurality of through-die interconnects includes a projection portion that projects beyond the recessed surface, but not beyond the plane of the back-side surface.

16. Stacked microelectronic dies, comprising:
a first microelectronic die having a back-side surface, a surface depression in the back-side surface, and a first metal contact located within the surface depression;
a second microelectronic die having a front-side surface and a second metal contact located at the front-side surface;
a die-to-die interconnect connecting the first metal contact with the second metal contact, the die-to-die interconnect including a flowable metal material that at least partially fills the surface depression;
a through-die interconnect extending through the first die with a first end of the through-die interconnect connecting with the flowable metal of the die-to-die interconnect; and
the first end of through-die interconnect recessed below the back side surface of the first microelectronic die or below any layers on the back side surface of the first microelectronic die.

17. The stacked microelectronic dies of claim 16 wherein the back-side surface of the first die contacts the front-side surface of the second die.

* * * * *